US008754655B2

(12) United States Patent
Brochu, Jr. et al.

(10) Patent No.: US 8,754,655 B2
(45) Date of Patent: Jun. 17, 2014

(54) TEST STRUCTURE, METHOD AND CIRCUIT FOR SIMULTANEOUSLY TESTING TIME DEPENDENT DIELECTRIC BREAKDOWN AND ELECTROMIGRATION OR STRESS MIGRATION

(75) Inventors: David G. Brochu, Jr., Hardwick, VT (US); Fen Chen, Williston, VT (US); Roger A. Dufresne, Fairfax, VT (US); Travis S. Merrill, Rutland, VT (US); Michael A. Shinosky, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 13/207,485

(22) Filed: Aug. 11, 2011

(65) Prior Publication Data
US 2013/0038334 A1    Feb. 14, 2013

(51) Int. Cl.
G01R 31/02    (2006.01)

(52) U.S. Cl.
USPC ............... 324/537; 324/756.01; 257/773

(58) Field of Classification Search
USPC ........ 324/71.1, 763, 526, 610, 648, 706, 725; 257/773
See application file for complete search history.

(56) References Cited

U.S. PATENT DOCUMENTS

| 5,533,197 | A | 7/1996 | Moran et al. |
| 6,724,214 | B2 | 4/2004 | Manna et al. |
| 7,212,022 | B2 | 5/2007 | Suzuki |
| 2002/0017906 | A1 | 2/2002 | Ho et al. |
| 2008/0246491 | A1* | 10/2008 | Ogawa et al. ............ 324/519 |
| 2010/0045326 | A1* | 2/2010 | Archer et al. ............ 324/763 |
| 2010/0219533 | A1* | 9/2010 | Ootake et al. ............ 257/773 |
| 2010/0327892 | A1 | 12/2010 | Agarwal et al. |
| 2011/0074459 | A1 | 3/2011 | Ruan et al. |

OTHER PUBLICATIONS

Hauschildt et al., Large-Scale Electromigration Statistics for Cu Interconnects, Mater. Res. Soc. Symp. Proc. vol. 1156 2009 Materials Research Society, 12 pages.

\* cited by examiner

*Primary Examiner* — Vincent Q Nguyen

(74) *Attorney, Agent, or Firm* — Schmeiser, Olsen & Watts; Michael LeStrange

(57) ABSTRACT

Test structures for simultaneously testing for electromigration or stress migration fails and time dependent dielectric breakdown fails in integrated circuits, test circuits using four test structures arranged as a bridge balance circuit and methods of testing using the test circuits. The electromigration or stress migration portions of the test structures include via chains of wire segments connected in series by electrically conductive vias, the wire segments formed in at least two adjacent wiring levels of an integrated circuit. The time dependent dielectric breakdown portions of the test structures include digitized wire structures in one of the at least two adjacent wiring levels adjacent to a less than whole portion of the wire segments in the same wiring level as the digitized wire structures.

25 Claims, 7 Drawing Sheets

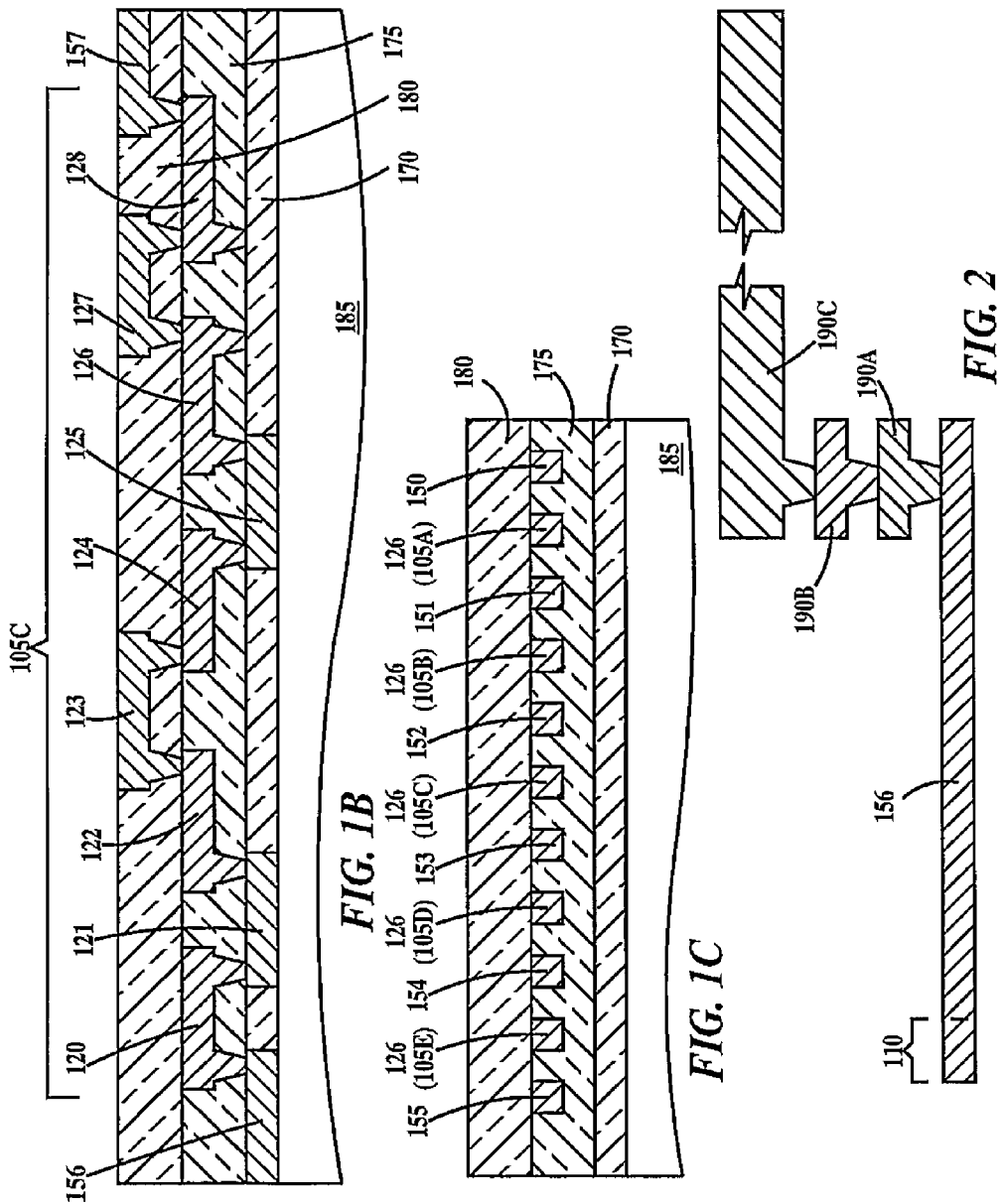

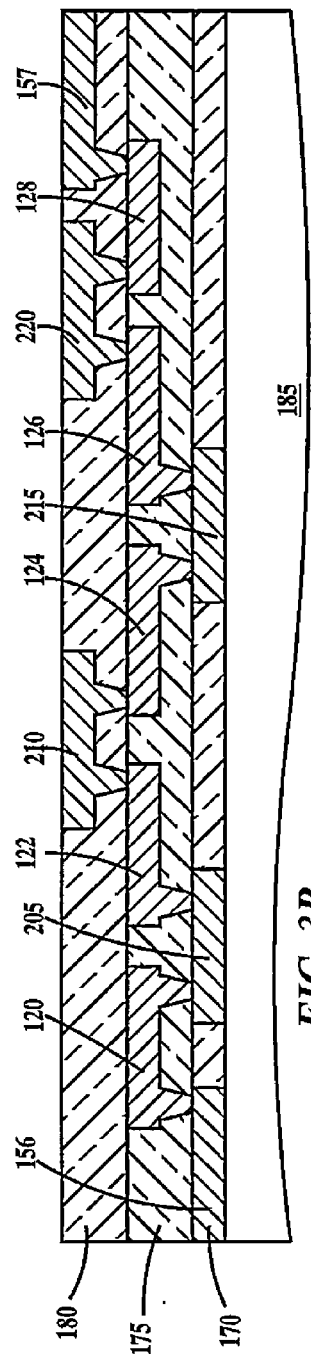
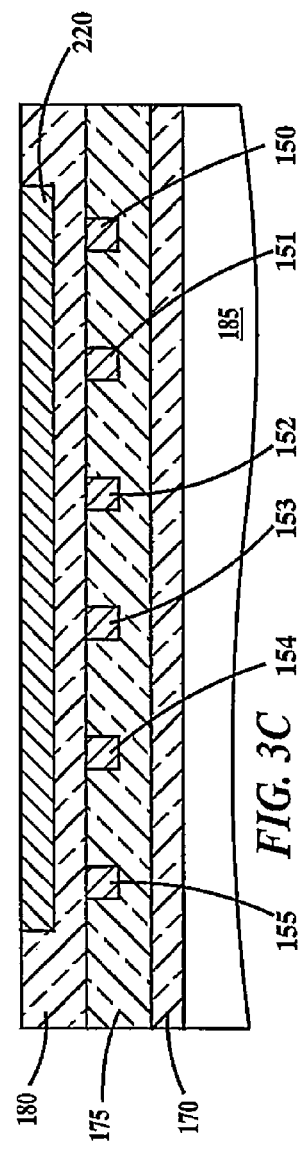
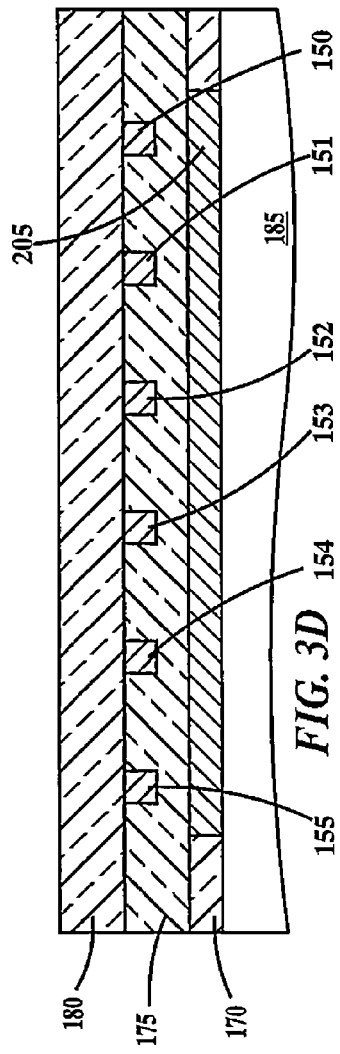
FIG. 3B
FIG. 3C
FIG. 3D

TEST STRUCTURE, METHOD AND CIRCUIT FOR SIMULTANEOUSLY TESTING TIME DEPENDENT DIELECTRIC BREAKDOWN AND ELECTROMIGRATION OR STRESS MIGRATION

FIELD OF THE INVENTION

The present invention relates to the field of integrated circuit testing; more specifically, it relates to a structure, method and circuit for simultaneously testing for time dependent dielectric breakdown and electromigration fails or simultaneously testing time dependent dielectric breakdown and stress migration fails in integrated circuits.

BACKGROUND

Conventional testing of the interconnect wiring levels of integrated circuits requires three separate reliability tests to be performed, time dependent dielectric breakdown, electromigration and stress migration as using independent structures and tests. However, in real integrated circuit operation, the mechanisms that cause time dependent dielectric breakdown, electromigration and stress migration can interact. Not only do conventional testing methods not account for these interactions, but are wasteful of time and test resources as the first failure time from one of those three mechanisms determines the entire chip reliability. Accordingly, there exists a need in the art to mitigate the deficiencies and limitations described hereinabove.

SUMMARY

A first aspect of the present invention is a test structure, comprising: a via chain comprising: a set of wire segments connected in series by electrically conductive vias, the wire segments formed in at least two adjacent wiring levels of an integrated circuit; and first and second pads connected to respective opposite first and second ends of the set of wire segments; a digitated wire structure formed in one of the at least two adjacent wiring levels, finger wires of the digitated wire structure parallel to and on opposite sides of at least a section of the via chain; and a third pad electrically connected to the digitated wire structure.

A second aspect of the present invention is a test structure, comprising: four identically designed units configured as bridge balance circuit, each unit of the four units comprising an electromigration (EM) test structure and a time-dependent dielectric breakdown (TDDB) structure; the electromigration test structure comprising wire segments connected by electrically conductive vias; the time-dependent dielectric breakdown structure comprising a less than whole portion of the wire segments and a digitated wire structure, finger wires of the digitated wire structure arranged parallel to and in a same plane as the less than whole portion of the wire segments; and the test structure configured to simultaneously detect electromigration fails and time dependent dielectric breakdown fails of the test structure.

A third aspect of the present invention is a test structure, comprising: four identically designed units configured as bridge balance circuit, each unit of the four units comprising a stress migration (SM) test structure and a time-dependent dielectric breakdown (TDDB) structure; a stress migration test structure comprising a via chain comprising wire segments in adjacent first and second wiring levels and interconnected by electrically conductive vias; the time-dependent dielectric breakdown structure comprising (i) a first less than whole portion of the wire segments and a digitated wire structure in the first wiring level and (ii) a second less than whole portion of the wire segments in a second wiring level, the second less than whole portion of the wire segments overlapping some or all of the digitated wire structure; and the test structure configured to simultaneously detect electromigration fails and time dependent dielectric breakdown fails of the test structure.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 1B is a cross-section through line 1B-1B of FIG. 1A;

FIG. 1C is a cross-section through line 1C-1C of FIG. 1A;

FIG. 2 is a cross-section illustrating a structure for connecting to the pads of test structure of FIG. 1A.

FIG. 3B is a cross-section through line 3B-3B of FIG. 3A;
FIG. 3C is a cross-section through line 3C-3C of FIG. 3A;
FIG. 3D is a cross-section through line 3D-3D of FIG. 3A;

DETAILED DESCRIPTION

Figure 1A:
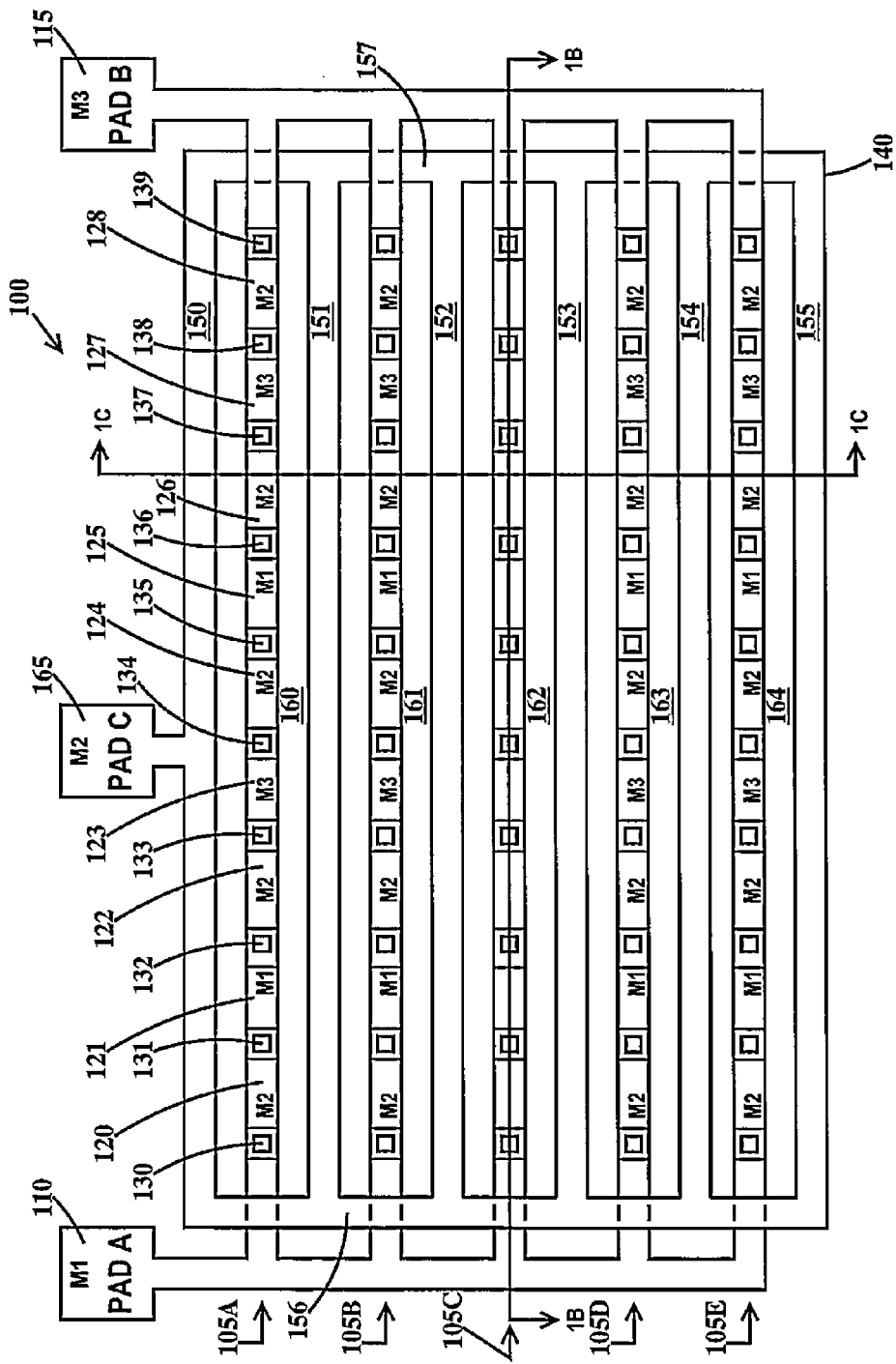
FIG. 1A is a top view of a test structure for testing TDDB and EM simultaneously according to an embodiment of the present invention.

In time dependent dielectric breakdown (TDDB) reliability stress testing, a constant voltage is applied between two interconnect wires insulated by the dielectric and current leakage across the dielectric is monitored. When done conventionally, no current flow is applied to the interconnect wires during TDDB stress. In electromigration (EM) reliability stress testing a constant current is applied to an interconnect wire and the resistance of the wire is monitored. When done conventionally, no voltage bias is applied to adjacent wires. Conventional stress migration (SM) reliability stress testing is performed in a manner similar to EM reliability stress testing but without applying current. A structure with large plates over and under a small via usually is preferred for increased sensitivity for SM. The embodiments of the present invention perform EM and TDDB or SM and TDDB reliability stress testing simultaneously using a structure where current flow is allowed in the TDDB structures and wires adjacent to the EM or SM wires are biased which simulates real integrated chip operation.

An EM fail is caused by electromigration of metal atoms in a wire when a constant current is applied to the wire causing voids in the wire which in turn increase the resistance of the wire. EM fails are of particular interest when copper or aluminum wires are used. An SM fail is caused by relaxing of the stress (generally tensile) induced into a damascene or a dual-damascene wire causing diffusion of vacancies leading to the formation of voids in the wire. These voids increase the resistance of the wire. SM fails are of particular interest for the combination of copper wires and low K (dielectric constant) or ultra-low K dielectrics are used because the high thermal coefficient of expansion differences between the materials. TDDB fails are caused by a breakdown in the dielectric material separating two wires when a voltage bias is applied across the two wires so leakage current flows between the two wires. TDDB fails are of particular interest when low K or ultra-low K dielectrics are used in combination with high voltage circuits (e.g., voltages in excess of about 10 volts).

The test structures of embodiments of the present invention are illustrated using damascene and dual damascene wires. A damascene process is one in which wire trenches or via openings are formed in an interlevel dielectric layer (ILD), an electrical conductor of sufficient thickness to fill the trenches is deposited in the trenches and on a top surface of the dielectric. A chemical-mechanical-polish (CMP) process is performed to remove excess conductor and make the surface of the conductor co-planar with the surface of the dielectric layer to form damascene wires (or damascene vias) in the ILD. When only a trench is formed in the ILD, the process is called single-damascene. When via openings and a trench are formed in the ILD, the process is called dual-damascene. An ILD layer and its damascened wires and/or vias make up a wiring level of an integrated circuit.

In one example, the damascene and dual damascene wires of the test structures of the embodiments of the present invention comprise copper. In one example, the damascene wires of the test structures of the embodiments of the present invention comprise a copper (Cu) core and layers of tantalum (Ta) and tantalum nitride (TaN) or layers if titanium (Ti) and titanium nitride (TiN) on the sidewalls and bottom surface of the core conductor. The Ta or Ti is disposed in a layer between the Cu and the TaN or TiN respectively.

In one example, the ILD layers of the test structures of the embodiments of the present invention independently comprise materials selected from the group consisting of porous or nonporous silicon dioxide ($SiO_2$), silicon nitride ($Si_3N_4$), fluorinated $SiO_2$ (FSG), silicon carbide (SiC), silicon oxy nitride (SiON), silicon oxy carbide (SiOC), plasma-enhanced silicon nitride ($PSiN_x$), low K materials such as hydrogen silsesquioxane polymer (HSQ), methyl silsesquioxane polymer (MSQ), organosilicate glass (methyl doped silica or $SiO_x(CH_3)_y$, or $SiC_xO_yH_y$ or SiCOH), and polyphenylene oligomer (e.g., SiLK™ manufactured by Dow Chemical Company of Midland, Tex.), and ultra-low K materials such as octamethyl-cyclotetrailoxane. A low K dielectric material has a relative permeability between about 2.5 and about 3.5. An ultra-low K dielectric material has a relative permeability less than about 2.5.

FIG. 1A is a top view of a test structure for testing TDDB and EM simultaneously according to an embodiment of the present invention. Wiring levels of integrated circuits may be labeled M1, M2, M3... MX where M1 is the lowermost wiring level (closest to the semiconductor substrate of the integrated circuit and MX is the uppermost wiring level (furthest from the semiconductor substrate). In FIG. 1A, a test structure 100 comprises five via chains 105A, 105B, 105C, 105D and 105E arranged in parallel between a first pad 110 (PAD A) and a second pad 115 (PAD B). Each of via chains 105A through 105E includes wire segments 120, 121, 122, 123, 124, 125, 126, 127 and 128. M1 first pad 110 is connected to M2 wire segment 120 by via 130. M2 wire segment 120 is connected to M1 wire segment 121 by via 131. M1 wire segment 121 is connected to M2 wire segment 122 by via 132. M2 wire segment 122 is connected to M3 wire segment 123 by via 133. M3 wire segment 123 is connected to M2 wire segment 124 by via 134. M2 wire segment 124 is connected to M1 wire segment 125 by via 135. M1 wire segment 125 is connected to M2 wire segment 126 by via 136. M2 wire segment 126 is connected to M3 wire segment 127 by via 137. M3 wire segment 127 is connected to M2 wire segment 128 by via 138. M2 wire segment 128 is connected to M3 second pad 115 by via 139. Other configurations such as M1-V1-M2-V1-M1 only and M2-V2-M3-V2-M2 only could also be implemented. It is preferred that the lengths of the M1, M2 and M3 wire segments of via chains 105A through 105E be the same. In one example, the lengths of the M1, M2 and M3 wire segments are the same length and between about 100 microns and about 1000 microns.

Test structure 100 further includes an M2 digitated wire structure 140. An integral digitated wire structure 140 comprises a set of six horizontal and parallel M2 finger wires 150, 151, 152, 153, 154 and 155 having their opposite ends connected to vertical and parallel bus wires 156 and 157. Via chain 105A is disposed in an opening 160 between finger wires 150 and 151 and bus wires 156 and 157. Via chain 105B is disposed in an opening 161 between finger wires 151 and 152 and bus wires 156 and 157. Via chain 105C is disposed in an opening 162 between finger wires 152 and 153 and bus wires 156 and 157. Via chain 105D is disposed in an opening 163 between finger wires 153 and 154 and bus wires 156 and 157. Via chain 105E is disposed in an opening 164 between finger wires 154 and 155 and bus wires 156 and 157. Digitated wire structure 140 includes an M2 third pad 165 (PAD C). Finger wires 150, 151, 152, 153, 154 and 155, bus wires 156 and 157, and M2 third pad 165(C) are integrally formed. While respective opposite ends of finger wires 150, 151, 152, 153, 154 and 155 are connected by bus wires 156 and 157, bus wire 157 is optional.

Test structure 100 is designed to perform TDDB stressing on level M2 ILD with V1 and V2 vias as structure 140 comprises only M2 wires. If structure 140 comprises only M3 wires, test structure is designed to perform TDDB stressing on level M3. In one example, structure 140 may comprise M1, M2 and M3 together, in which case test structure 100 is designed to perform TDDB stress on levels M1, M2, and M3. Test structure 100 is designed to perform EM monitoring on via strings 105A through 105E. While only five via chains each having only ten vias each, the more chains and the longer the chains, the more sensitive the EM test will be. For example, there may be thousands of vias in each via chain and there may be tens to hundreds of via chains.

FIG. 1B is a cross-section through line 1B-1B of FIG. 1A. In FIG. 1B, via chain 105C is illustrated. In FIG. 1B, M1 finger wire 156, M1 wire segments 121 and 125 are single damascene wires formed in an ILD layer 170, M2 wire segments 120, 122, 124, 126 and 128 are dual-damascene wires formed in an ILD layer 175 and M2 wire segments 123 and 127 and M2 finger wire 157 are dual-damascene wires formed in an ILD layer 180. ILD layer 170 is formed on a semiconductor substrate 185 that may include an M0 wiring level (between M1 and the substrate), a contact layer and active devices such as transistors.

FIG. 1C is a cross-section through line 1C-1C of FIG. 1A. In FIG. 1C, in ILD layer 175, M2 wire segments 126 of via chains 105A through 105E are interspersed with M2 finger wires 150 through 155 of digitated wire structure 140 (see FIG. 1A). M2 wire segments 126 of via chains 105A through 105E and M2 finger wires 150 through 155 of digitated wire structure 140 (see FIG. 1A) are formed in ILD layer 175. There are no wires in ILD layer 170 directly below M2 wire segments 126 of via chains 105A through 105E and M2 finger wires 150 through 155. There are no wires in ILD layer 180 directly above M2 wire segments 126 of via chains 105A through 105E and M2 finger wires 150 through 155.

FIG. 2 is a cross-section illustrating a structure for connecting to the pads of test structure of FIG. 1A. In FIG. 2, first pad 110 (M1) is integral with wire segment 156. Wire segment 156 connects to dual-damascene wire 190A which is connected to dual-damascene wire 190B which is connected to a test pad 190C. ILD layers are not illustrated in FIG. 2. Similar structures in M2 and M3 would connect third pad 115 (see FIG. 1A) and similar structures in M3 would connect third pad 165 (see FIG. 1A) to respective test pads.

Figure 3A:
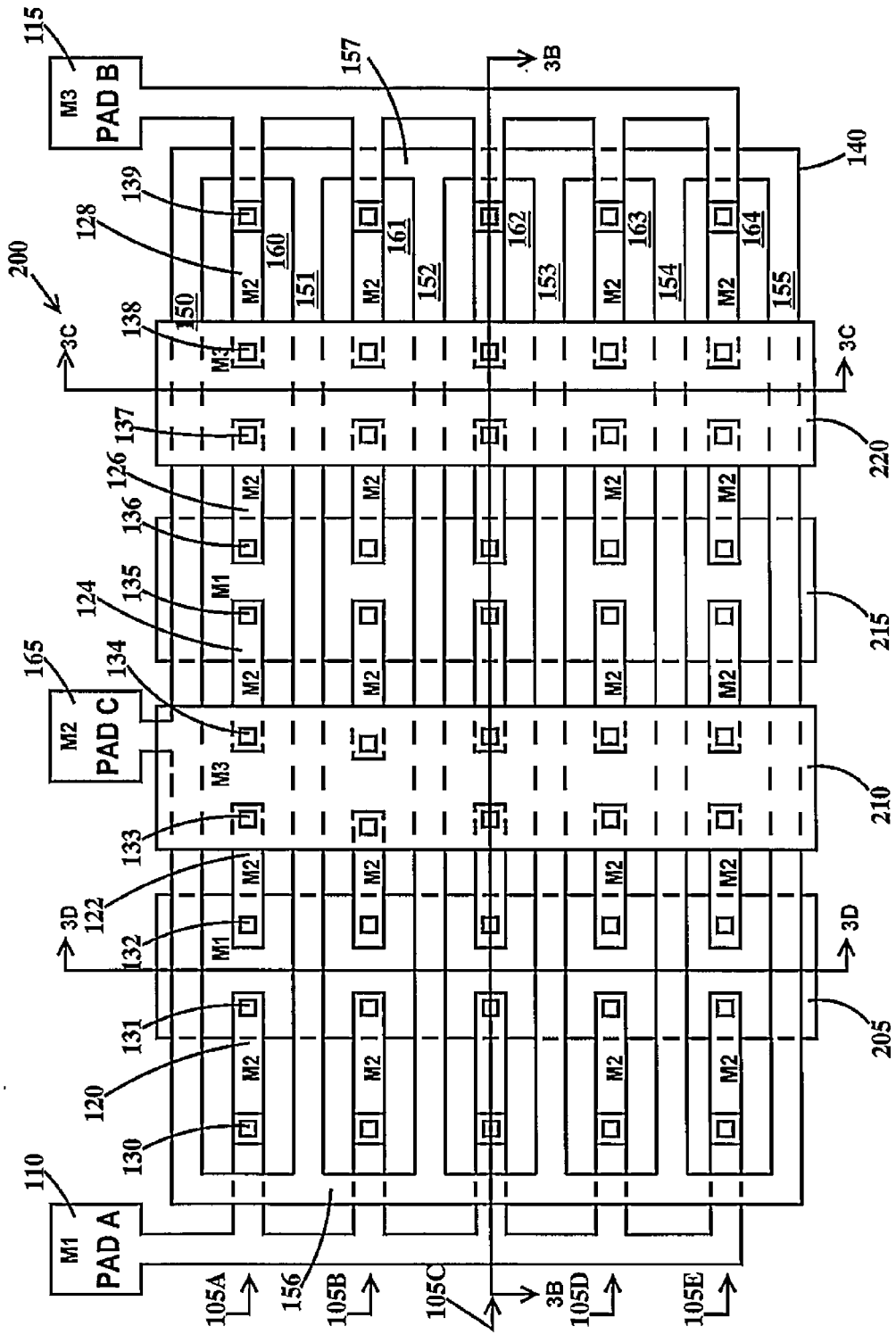
FIG. 3A is a top view of a test structure for testing TDDB and SM simultaneously according to an embodiment of the present invention.

FIG. 3A is a top view of a test structure for testing TDDB and SM simultaneously according to an embodiment of the present invention. In FIG. 3A, a test structure 200 is similar to test structure 100 of FIG. 1A with the following changes: (1) Individual M1 wire segments 121 of via chains 105A through 105E are replaced with a single M1 plate 205 to which vias 131 and 132 of via chains 105A-through 105E connect. (2) Individual M3 wire segments 123 of via chains 105A through 105E are replaced with a single M3 plate 210 to which vias 133 and 134 of via chains 105A through 105E connect. (3) Individual M1 wire segments 125 of via chains 105A through 105E are replaced with a single M1 plate 215 to which vias 135 and 136 of via chains 105A through 105E connect. (4) M3 wire segments 127 of via chains 105A through 105E are replaced with a single M3 plate 220 to which vias 137 and 138 of via chains 105A through 105E connect plates 205, 210, 215 and 220 and the vias connected to them form the SM monitor. The lengths of M2 segments and the widths of M1 and M3 plates may be the same or different. In one example, the lengths of M2 segments and the widths of M1 and M3 plates are independently between about 100 microns and about 1000 microns.

FIG. 3B is a cross-section through line 3B-3B of FIG. 3A. In FIG. 3B, via chain 105C is illustrated. In FIG. 3B, M1 finger wire 156, M1 plate 205 and M1 plate 215 are single damascene wires formed in ILD layer 170, M2 wire segments 120, 122, 124, 126 and 128 are dual-damascene wires formed in an ILD layer 175 and M3 plate 210 and M3 plate 220 and finger wire 157 are dual-damascene wires formed in an ILD layer 180.

FIG. 3C is a cross-section through line 3C-3C of FIG. 3A. In FIG. 3C, the M3/M2 SM monitor portion of test structure 220 (see FIG. 3A) is illustrated. In FIG. 3C, M2 finger wires 150 through 155 of digitated wire structure 140 (see FIG. 3A) are formed in ILD layer 175. M3 plate 220 is formed in ILD layer 180 and there are no wires in ILD layer 170 directly below M2 finger wires 150 through 155.

FIG. 3D is a cross-section through line 3D-3D of FIG. 3A. In FIG. 3D, the M1/M2 SM monitor portion of test structure 205 (see FIG. 1A) is illustrated. In FIG. 3D, M2 finger wires 150 through 155 of digitated wire structure 140 (see FIG. 3A) are formed in ILD layer 175. M1 plate 205 is formed in ILD layer 170. There are no wires in ILD layer 180 directly above M2 finger wires 150 through 155.

Figure 4:
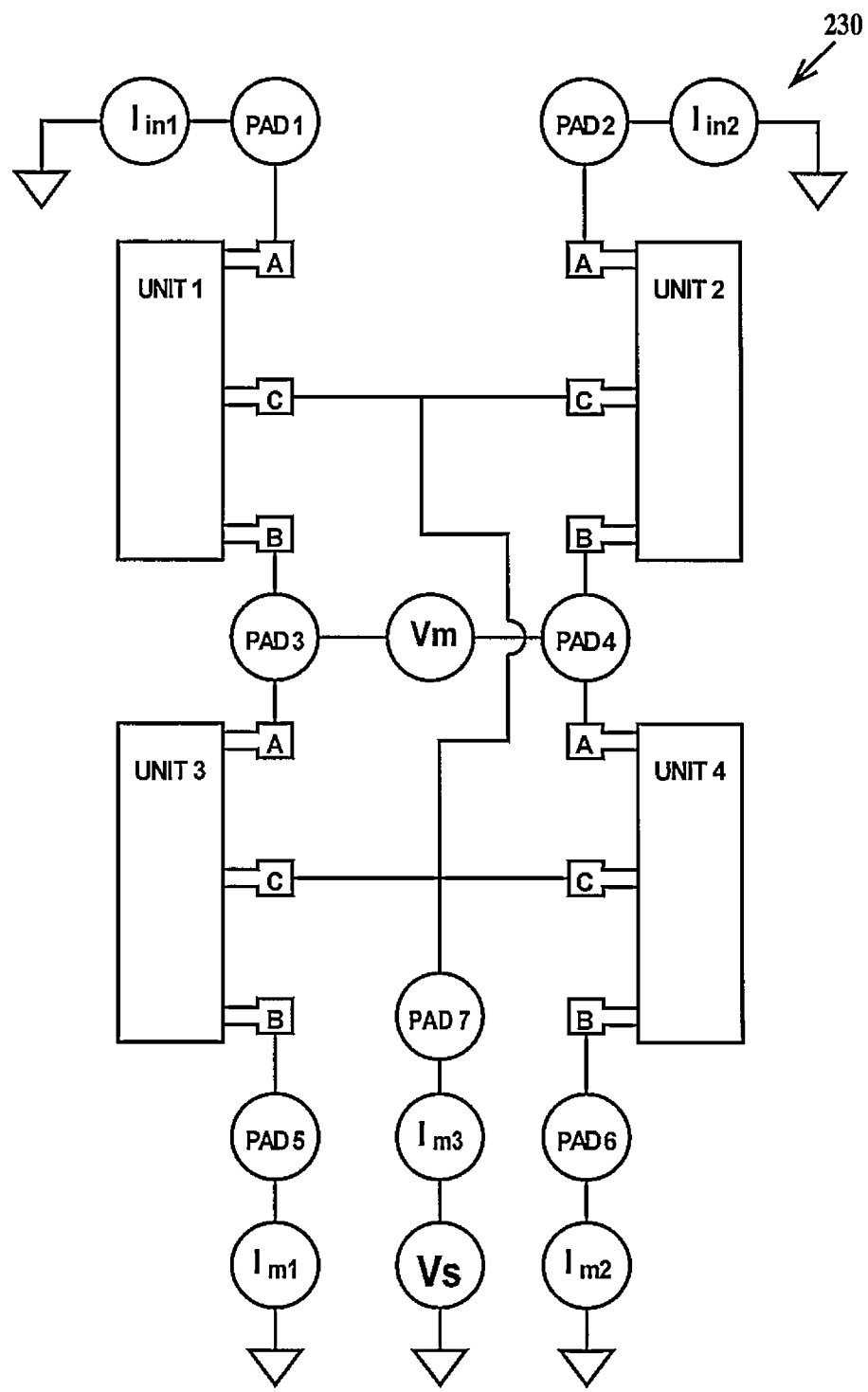
FIGS. 4 and 5 are a circuits for measuring TDDB and EM or SM simultaneously according to an embodiment of the present invention.

FIG. 4 is a circuit for measuring TDDB and EM or SM simultaneously according to an embodiment of the present invention. In FIG. 4, four identically designed units 1, 2, 3 and 4 are arranged in a test circuit 230. It is desirable that units 1, 2, 3 and 4 be as physically identical as possible, so the terminology "identically designed" takes into account very small allowable variations between the four units due to local differences such as wire widths, wire spacing, wire thickness and dielectric thickness caused by the fabrication process so operationally the four units are "identical." Each of units 1 through 4 are either the TDDB/EM test structure 100 of FIG. 1A or the TDDB/SM test structure of FIG. 3A. There are seven test pads 1 through 7 which can be connected to a tester during TDDB/EM or TDDB/SM stress testing. The A pad of unit 1 is connected to test pad 1, the B pad of unit 1 is connected to test pad 3 and the C pad of unit 1 is connected to test pad 7. The A pad of unit 2 is connected to test pad 2, the B pad of unit 2 is connected to test pad 4 and the C pad of unit 2 is connected to test pad 7. The A pad of unit 3 is connected to test pad 3, the B pad of unit 3 is connected to test pad 5 and the C pad of unit 3 is connected to test pad 7. The A pad of unit 4 is connected to test pad 4, the B pad of unit 4 is connected to test pad 6 and the C pad of unit 4 is connected to test pad 7. Test pad 1 is connected to a first current source Iin1 and test pad 2 is connected to a second current source Iin2. A voltmeter Vm is connected between test pads 3 and 4. Test pad 5 is connected to a first current meter Im1 and test pad 6 is connected to a second current meter Im2. Two current sources are used to assure uniform current distributions and better balance in EM and SM measurements. Test pad 7 is connected to a voltage source Vs and a third current meter Im3. Test pads 1, 3 and 5 are electrically connected by units 1 and 3 and test pads 2, 4 and 6 are electrically connected by units 2 and 4. Test circuit 230 is essentially a bridge balance circuit (e.g., Wheatstone bridge) with units 1, 2, 3 and 4 being the four resistors of the bridge.

For TDDB/EM stress testing, a voltage is applied to test pad 7 and current applied to test pads 1 and 2. For TDDB/SM stress testing, a voltage is applied to test pad 7 but no current applied to test pads 1 and 2. Im1 and Im2 are monitored for changes in current flow which is a measure of the degree of dielectric breakdown. The two current meters IM1 and IM2 allow determination of whether the TDDD fail is in units 1 or 3 or whether the fail is in units 2 or 4.

For EM or SM stress testing, the voltmeter Vm is monitored for a change in voltage which is a measure of an increase in resistance in the via chain. The EM monitor utilizes multiple via chains tied in parallel at the ends of the chains while the SM monitor utilizes multiple via chains tied in parallel at the ends of the chains, but further ties the via chains in parallel internally using metal plates.

Voltmeter Vm is monitored for a change in voltage and current meters Im1, Im2 and Im3 are monitored simultaneously for changes in current so both TDDB and EM or TDDB and SM can be tested simultaneously. If voltmeter Vm detects a change in voltage, but current meter Im3 does not detect a change in current then the fail is an EM or SM fail. If voltmeter Vm detects a change in voltage and simultaneously current meter Im3 detects a change in current, then the fail is a TDDB fail. Test circuit 230 also allows TDDB, EM and SM to be tested independently.

Test circuit 230 may be placed in unused portions of an integrated circuit chip or in the street (kerf) area between integrated circuit dies (chips) on un-singulated wafers. Multiple integrated circuit chips are fabricated simultaneously on semiconductor substrates called wafers which are then singulated (separated) by dicing in the kerf regions between the individual chips.

Figure 5:
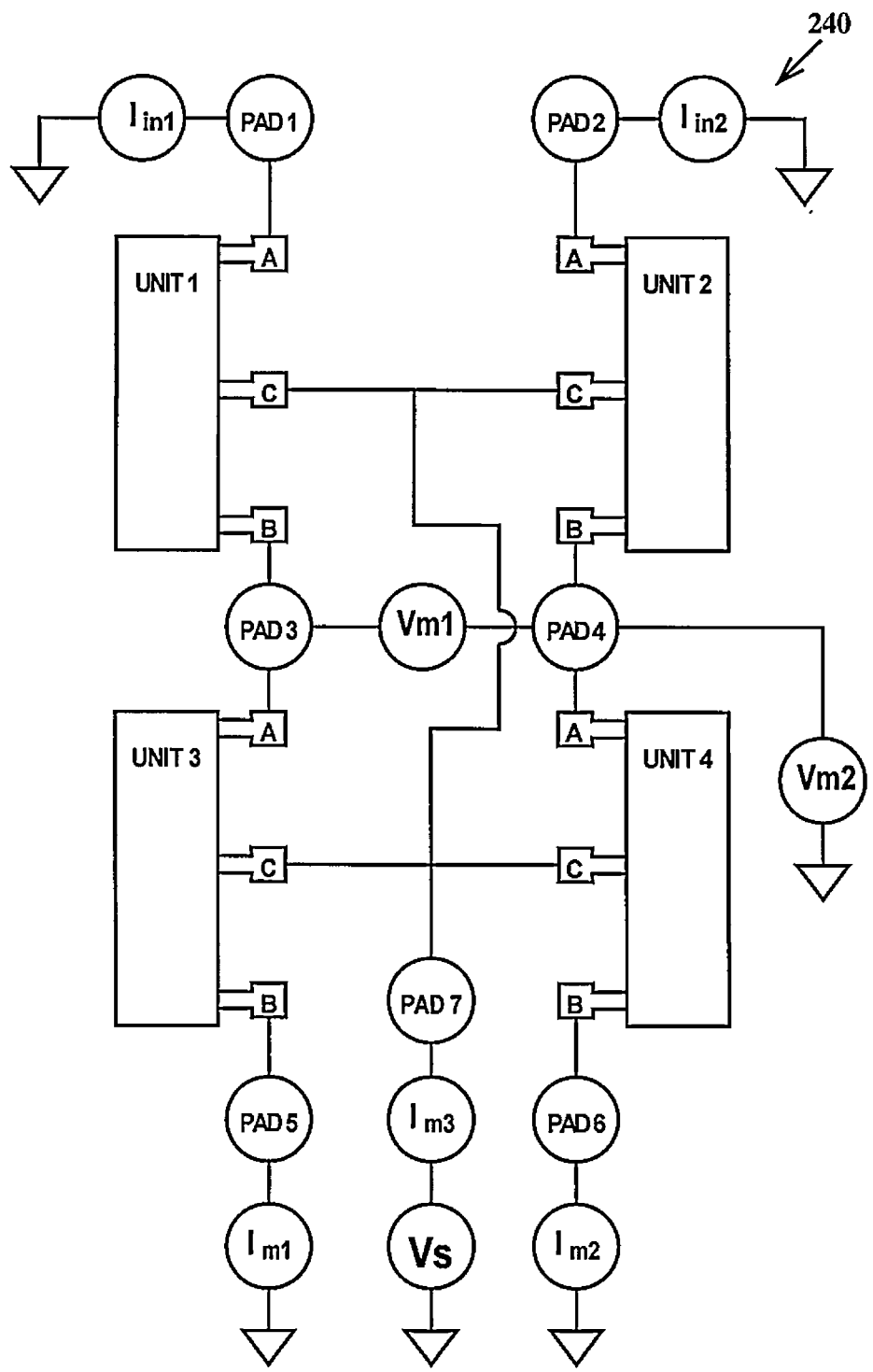

In FIG. 5, a test circuit 240 is similar to test circuit 230 of FIG. 4 except and additional voltmeter Vm2 is connected to test pad 4 (alternatively to test pad 3). Thus, the voltages on voltmeters Vm1 and Vm2 and the currents on current meters Im1, Im2 and Im3 are monitored. Voltmeter Vm2 will register a change in voltage only if there is a simultaneous about equal resistance shift in unit 1and unit 2 or in unit 3 and unit 4, indicating a fail that would not be detected by test circuit 230.

As an example of the sensitivity to EM fails, assume that the resistance of units 1, 2, 3 and 4 are each 5000 Ohms (e.g., 100 via links of 50 Ohm each). Assume a 10 Ohm change in one link (20% change) of unit 1. The change in resistance of R1 is 0.2% which would be undetectable by conventional EM methods. However, using test circuit 230 (which comprises four test units having test structure 100 of FIG. 1A or test structure 200 of FIG. 3A) the change in voltage would be −25 mV which is easily detected. Further, if the voltage change is negative, the EM fail is in unit 1 or 4. If the voltage change is positive, the fail is in unit 2 or 3.

Figure 6:
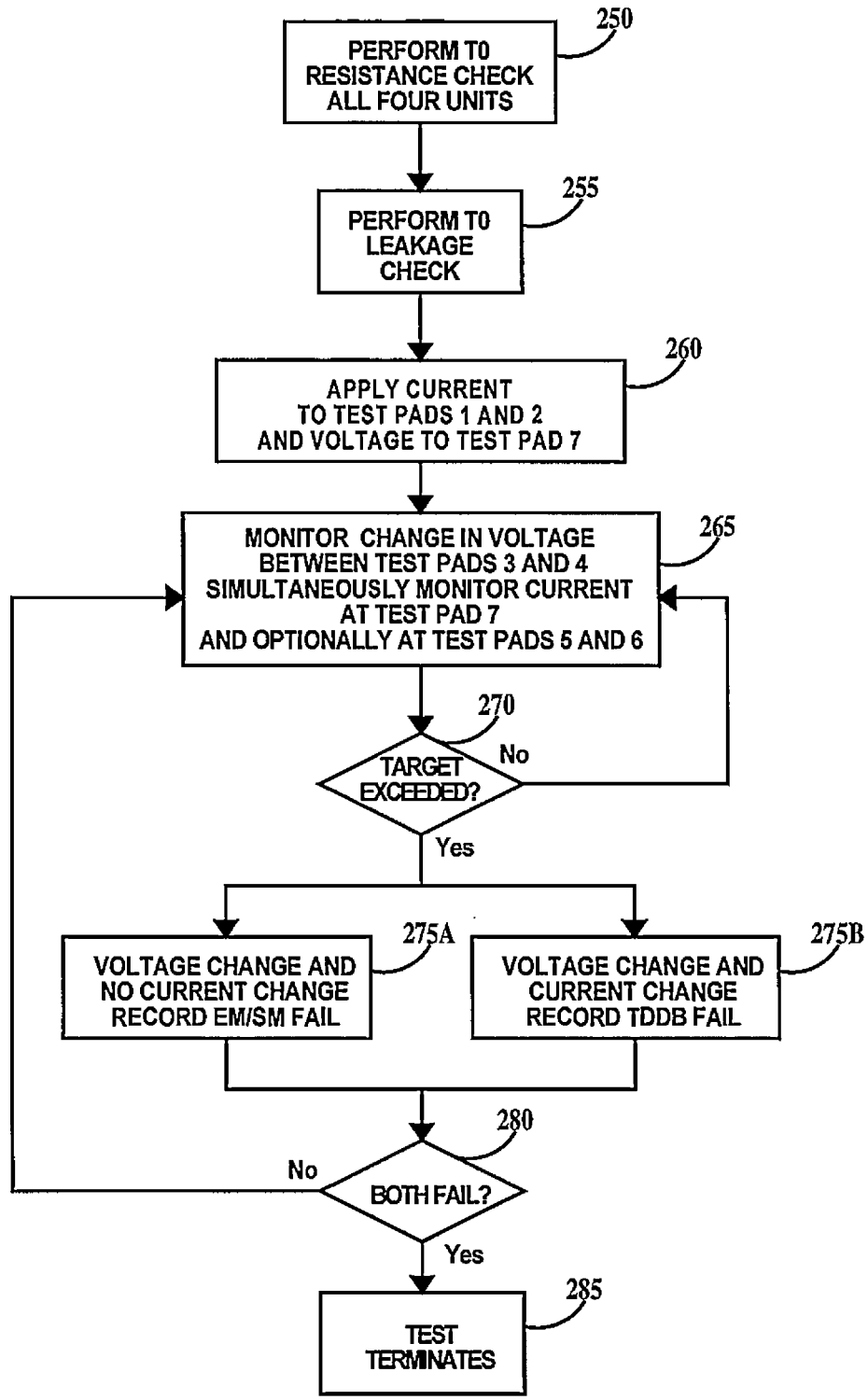
FIG. 6 is a flowchart of a method for measuring TDDB and EM or SM simultaneously according to an embodiment of the present invention.

FIG. 6 is a flowchart of a method for measuring TDDB and EM or SM simultaneously according to an embodiment of the present invention. In step 250, a resistance check of the test circuit is performed. Neither an open or short should be detected and the resistance measured should be within an initial resistance specification for the test structure. In step 255, a time zero (T0) leakage check of the circuit is performed. The current measured should be within an initial leakage current specification for the test structure. If both checks are passed, then the method proceeds to step 260 (if not, the method terminates). In step 260, current is applied to test pads 1 and 2 and a voltage to test pad 7 (see FIG. 4). In step 265, the voltage between test pads 3 and 4 is monitored and current at test pad 7 and optionally at test pads 5 and 6 is monitored (see FIG. 4). If either a change in voltage greater than a threshold target (X) or a change in current at test pad 7 is greater than the absolute value of a current threshold target (Y) then the method proceeds to respective steps 275A and 275B. If not, the method loops between steps 265 and 270. In step 275A, if the voltage threshold target (X) was exceeded in step 265 but not the current threshold target (Y) an EM or SM failure is recorded and further EM or SM testing is terminated. In step 275B, if both the voltage threshold target (X) and the current threshold target (Y) and were simultaneously exceeded in step 265 a TDDB failure is recorded and further TDDB testing is terminated. The method then proceeds to step 280. In step 280, if both TDDB and EM or SM failure was recorded in steps 275A and 275B, the method proceeds to step 285 and testing is terminated. If, in step 280, only one test has a fail recorded, the method loops back to step 265 and only the monitoring required for the non-failing test is performed.

In one example, the method and test circuits described supra, may be connected to a test apparatus (tester) as known in the art by a set of probes contacting test pads 1 through 7 (see FIGS. 4 and 5). Referring to FIGS. 4 and 5, the tester includes the current sources Iin1 and Iin2, voltage source Vs, voltmeters Vm1 and Vm2 (optional), current meters Im1, Im2, and Im3.

Thus, the embodiments of the present invention provide test structures, test circuits and test methods for simultaneously testing for time dependent dielectric breakdown and electromigration fails or simultaneously testing time dependent dielectric breakdown and stress migration fails in integrated circuits thus providing more efficient and more accurate testing. Alternatively, current sources Iin1 and Iin2 and voltage source Vs could be derived from circuits on the integrated chip, and the integrated chip connected to an external power source feeding the internal current sources Iin1 and Iin2 and voltage source Vs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A test structure, comprising:
a via chain on a substrate, said via chain comprising:
at least two first wire segments in a first wiring level, at least two second wire segments in a second wiring level and at least two third wire segments in a third wiring level, said second wiring level between said first wiring level and said third wiring level, said first, second and third wire segments electrically connected in series by electrically conductive first vias located only between said first wire segments and second wire segments and by electrically conductive second vias located only between said second wire segments and said third wire segments, each wire segment of said first, second and third wire segments extending the length of said via chain in a direction parallel to a top surface of said substrate;
first and second pads connected to respective opposite first and second ends of said via chain;
a digitated wire structure in said second wiring level, finger wires of said digitated wire structure parallel to and on opposite sides of at least a section of said via chain, said digitated wire structure electrically isolated from said first via chain; and
a third pad electrically connected to said digitated wire structure.

2. The test structure of claim 1, including: said first set of wire segments in a first dielectric layer;
said second set of wire segments and said first vias in a second dielectric layer;
said third set of wire segments and said second vias in a third dielectric layer; and
said second dielectric layer between and abutting said first dielectric layer-and said third dielectric layer.

3. The test structure of claim 1, including:
an additional via chain comprising at least two additional first wire segments in said first wiring level, at least two additional second wire segments in said second wiring level and at least two additional third wire segments in said third wiring level, said additional first, additional second and additional third wire segments electrically connected in series by electrically additional first conductive vias located only between said additional first wire segments and said additional second wire segments and by electrically conductive additional second vias located only between said additional second wire segments and said additional third wire segments, each wire segment of said additional first, additional second and additional third wire segments extending the length of said additional via chain in a direction parallel to said top surface of said substrate; and
said digitated wire structure including an additional finger wire formed between said via chain and said additional via chain in the same wiring level as said digitated wire structure and integrally formed with said digitated wire structure; said digitated wire structure electrically isolated from said additional via chain.

4. The test structure of claim 3, further including:
wherein said second wire segments of said via chain and said additional second wire segments of said additional via chain are in the form of a plate connecting said via chain and said additional via chain in parallel and extending over said digitated wire structure.

5. A test circuit comprising:
identically designed first, second, third and forth units, each of said first, second, third and fourth units having the structure of claim 4;
the first pad of said first unit connected to a first test pad, the first pad of said second unit connected to a second test pad, the second pad of said first unit and the first pad of said third unit connected to a third test pad, the second pad of said third unit and the first pad of said fourth unit connected to a fourth test pad, the second pad of said third unit connected to a fifth test pad, the second pad of said fourth unit connected to a sixth test pad, and the third pads of each of said first, second, third and fourth units connected to a seventh test pad.

6. The test circuit of claim 5, including:
a first current source connected to said first test pad;
a second current source connected to said second test pad;
a voltmeter connected between said third and fourth test pads;
a first current meter connected to said fifth test pad;
a second current meter connected to said sixth test pad; and
a voltage source connected to said seventh test pad through a third current meter.

7. The test circuit of claim 6, including:
an additional voltmeter connected to either said third test pad or said fourth test pad.

8. The test circuit of claim 6, wherein said first current source, said second current source and said voltage source are connected to a common ground and one terminal of said first current meter, one terminal of said second current meter and one terminal of said additional voltage meter are connected to said common ground.

9. The test circuit of claim 5, wherein said first current source, said second current source and said voltage source are connected to a common ground and one terminal of said first current meter, one terminal of said second current meter are connected to said common ground.

10. A method, comprising:
connecting the test circuit of claim 5 to a test apparatus;
applying a voltage to test pad 7;
monitoring the voltage between test pads 3 and 4 and the current between test pad 7 and ground;
if there is a change voltage between test pads 3 and 4 and no change in current at test pad 7 then recording a stress migration (SM) fail of said test circuit; and
if a there is a change voltage between test pads 3 and 4 with a simultaneous change in current at test pad 7 then recording a time dependent dielectric breakdown (TDDB) fail of said test circuit.

11. The method of claim 10, including:
monitoring a voltage between test pad 3 or test pad 4 and ground;
if there is a change in voltage between test pad 3 or test pad 4 and ground, no change voltage between test pad 3 or test pad 4, and no change in current at test pad 7 then recording an stress migration fail of said test circuit; and
if there is a change in voltage between test pad 3 or test pad 4 and ground, no change voltage between test pad 3 or test pad 4, and a simultaneous change in current at test pad 7 then recording a time dependent dielectric breakdown of said test circuit.

12. The method of claim 10, including:
monitoring the current between test pad 5 and ground or between test pad 6 and ground or monitoring both the current between test pad 5 and ground and the current between test pad 6 and ground.

13. The test structure of claim 1, wherein said first wire segments are damascene wires, said second wire segments and said first vias are integral dual-damascene wires, and said third wire segments and said second vias are integral dual-damascene wires.

14. A test circuit comprising:
identically designed first, second, third and forth units, each of said first, second, third and fourth units having the structure of claim 1;
the first pad of said first unit connected to a first test pad, the first pad of said second unit connected to a second test pad, the second pad of said first unit and the first pad of said third unit connected to a third test pad, the second pad of said third unit and the first pad of said fourth unit connected to a fourth test pad, the second pad of said third unit connected to a fifth test pad, the second pad of said fourth unit connected to a sixth test pad, and the third pads of each of said first, second, third and fourth units connected to a seventh test pad.

15. The test circuit of claim 14, including:
a first current source connected to said first test pad;
a second current source connected to said second test pad;
a voltmeter connected between said third and fourth test pads;
a first current meter connected to said fifth test pad;
a second current meter connected to said sixth test pad; and
a voltage source connected to said seventh test pad through a third current meter.

16. The test circuit of claim 15, including:
an additional voltmeter connected to either said third test pad or said fourth test pad.

17. The test circuit of claim 16, wherein said first current source, said second current source and said voltage source are connected to a common ground and one terminal of said first current meter, one terminal of said second current meter and one terminal of said additional voltage meter are connected to said common ground.

18. The test circuit of claim 14, wherein said first current source, said second current source and said voltage source are connected to a common ground and one terminal of said first current meter, one terminal of said second current meter are connected to said common ground.

19. A method, comprising:
connecting the test circuit of claim 14 to a test apparatus;
applying a voltage to test pad 7 and current to test pads 1 and 2;
monitoring the voltage between test pads 3 and 4 and the current between test pad 7 and ground;
if there is a change voltage between test pads 3 and 4 and no change in current at test pad 7 then recording an electromigration (EM) fail of said test circuit; and
if a there is a change voltage between test pads 3 and 4 with a simultaneous change in current at test pad 7 then recording a time dependent dielectric breakdown (TDDB) fail of said test circuit.

20. The method of claim 19, including:
monitoring a voltage between test pad 3 or test 4 and ground;
if there is a change in voltage between test pad 3 or test pad 4 and ground, no change voltage between test pads 3 and 4, and no change in current at test pad 7 then recording an electromigration fail of said test circuit; and
if there is a change in voltage between test pad 3 or test pad 4 and ground, no change voltage between test pads 3 and 4, and a simultaneous change in current at test pad 7 then recording a time dependent dielectric breakdown fail of said test circuit.

21. The method of claim 19, including:
monitoring the current between test pad 5 and ground or between test pad 6 and ground or monitoring both the current between test pad 5 and ground and the current between test pad 6 and ground.

22. A test structure, comprising:
four identically designed units configured as bridge balance circuit, each unit of said four units comprising an electromigration (EM) test structure and a time-dependent dielectric breakdown (TDDB) structure;
said electromigration test structure comprising wire segments connected by electrically conductive vias;
said time-dependent dielectric breakdown structure comprising a less than whole portion of said wire segments and a digitated wire structure, finger wires of said digitated wire structure arranged parallel to and in a same plane as said less than whole portion of said wire segments; and
said test structure configured to simultaneously detect electromigration fails and time dependent dielectric breakdown fails of said test structure.

23. A test structure, comprising:
four identically designed units configured as bridge balance circuit, each unit of said four units comprising a stress migration (SM) test structure and a time-dependent dielectric breakdown (TDDB) structure;
a stress migration test structure comprising a via chain comprising wire segments in adjacent first and second wiring levels and interconnected by electrically conductive vias;
said time-dependent dielectric breakdown structure comprising (i) a first less than whole portion of said wire segments and a digitated wire structure in said first wiring level and (ii) a second less than whole portion of said wire segments in a second wiring level, said second less than whole portion of said wire segments overlapping some or all of said digitated wire structure; and
said test structure configured to simultaneously detect electromigration fails and time dependent dielectric breakdown fails of said test structure.

24. A method, comprising:
connecting the test circuit of claim 22 to a test apparatus, said balanced bridge circuit having first, second third and fourth nodes;
applying a voltage to each of said first, second, third and fourth units and current to said first node of said bridge balance circuit;
measuring a voltage between said second and third nodes and current between said fourth node and ground; and
detecting an electromigration fail by a change in voltage between second and third nodes and detecting a time dependent dielectric breakdown fail by a change in current between said fourth node and ground.

25. A method, comprising:
connecting the test circuit of claim 23 to a test apparatus, said balanced bridge circuit having first, second third and fourth nodes;
applying a voltage to each of said first, second, third and fourth units and current to said first node of said bridge balance circuit;
measuring a voltage between said second and third nodes and current between said fourth node and ground; and
detecting a stress migration fail by a change in voltage between second and third nodes and detecting a time dependent dielectric breakdown fail by a change in current between said fourth node and ground.

* * * * *